United States Patent
Xu

(10) Patent No.: US 9,800,240 B2
(45) Date of Patent: Oct. 24, 2017

(54) PHOTOCOUPLER ISOLATION SWITCH CIRCUIT

(71) Applicant: Shenzhen China Star Optoelectronics Technology Co., Ltd., Shenzhen, Guangdong (CN)

(72) Inventor: Fengcheng Xu, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 129 days.

(21) Appl. No.: 14/904,856

(22) PCT Filed: Sep. 9, 2015

(86) PCT No.: PCT/CN2015/089271
§ 371 (c)(1),
(2) Date: Jan. 13, 2016

(87) PCT Pub. No.: WO2017/028348
PCT Pub. Date: Feb. 23, 2017

(65) Prior Publication Data
US 2017/0237429 A1 Aug. 17, 2017

(30) Foreign Application Priority Data
Aug. 19, 2015 (CN) .......................... 2015 1 0511641

(51) Int. Cl.
*H01L 31/00* (2006.01)
*H03K 17/78* (2006.01)
*G09G 3/36* (2006.01)

(52) U.S. Cl.
CPC .......... *H03K 17/78* (2013.01); *G09G 3/3648* (2013.01); *G09G 2310/08* (2013.01); *G09G 2360/14* (2013.01)

(58) Field of Classification Search
USPC ............................................ 327/514; 326/89
See application file for complete search history.

(56) References Cited

U.S. PATENT DOCUMENTS

| | | | |
|---|---|---|---|
| 4,721,869 A * | 1/1988 | Okado | H03K 17/0828 326/14 |
| 2015/0333015 A1* | 11/2015 | Fu | H01L 27/1214 257/797 |
| 2016/0284824 A1* | 9/2016 | Nagata | H01L 29/407 |

(Continued)

*Primary Examiner* — Adam Houston
(74) *Attorney, Agent, or Firm* — Andrew C. Cheng

(57) ABSTRACT

A photocoupler isolation switch circuit is disclosed. The circuit includes a power chip and a voltage driving chip including a photocoupler device having a light emitting device and a photosensitive device. A first output terminal of the power chip connects to a first terminal of the light emitting device, and a second terminal of the light emitting device connects to ground; a second output terminal of the power chip connects to a first terminal of the photosensitive device and outputs a driving voltage, a second terminal of the photosensitive device connects to an output terminal of the photocoupler device; the photocoupler device controls a working status of the light emitting device according to a control voltage, the photosensitive device is turned on or off according to the working status; the driving voltage is outputted through the output terminal of the photocoupler device when the light emitting device is turned on.

20 Claims, 3 Drawing Sheets

(56) References Cited

U.S. PATENT DOCUMENTS

2017/0012551 A1* 1/2017 Kondo ................. H02M 5/458
2017/0133483 A1* 5/2017 Nagata ............. H01L 29/66348
2017/0169775 A1* 6/2017 Wang .................. G09G 3/3614

* cited by examiner

PHOTOCOUPLER ISOLATION SWITCH CIRCUIT

CROSS REFERENCE

This application claims the priority of Chinese Patent Application No. 201510511641.8, entitled "photocoupler isolation switch circuit", filed on Aug. 19, 2015, the disclosure of which is incorporated herein by reference in its entirety.

FIELD OF THE INVENTION

The present invention relates to a liquid crystal display technology field, and more particularly to a photocoupler isolation switch circuit.

BACKGROUND OF THE INVENTION

CMOS (Complementary Metal Oxide Semiconductor) is an amplifying device for a voltage control, and is a basic unit for forming a CMOS digital integrated circuit. A CMOS circuit (a MOS integrated circuit formed by PMOS tube and NMOS tube complementary and commonly) may generate a low impedance path between a power source and a ground because of an interactive affection between parasitic PNP and NPN bipolar transistor. The low impedance path will generate a large current between the power source and the ground, which is called as a latch up effect.

In a liquid crystal display field, a thin-film transistor (TFT) provides a driving voltage through a voltage driving chip, the voltage driving chip includes a CMOS circuit. A power chip provides a control voltage and a driving voltage for the voltage driving chip. When the control voltage rises up before the driving voltage (that is, in timing, the control voltage is prior to the driving voltage), the CMOS circuit will not generate a latch up effect. When the control voltage rises up after the driving voltage (that is, in timing, the control voltage is late with respect to the driving voltage), the CMOS circuit in the voltage driving chip is easily to generate the latch up effect. When the latch up effect is generated in the CMOS circuit of the voltage driving chip, the MOS tube in the voltage driving chip will break. Therefore, in order to prevent the CMOS circuit of the voltage driving chip to generate the latch up effect, usually, a timing control circuit is added inside the power chip to control that the control voltage rises up before the driving voltage. However, after adding the timing control circuit in the power chip, if the timing control circuit is abnormal, the CMOS circuit in the voltage driving chip is easily to generate a latch up effect.

SUMMARY OF THE INVENTION

The present invention provides a photocoupler isolation switch circuit, which can solve a voltage driving chip from generating a problem of a latch up effect.

The present invention provides a photocoupler isolation switch circuit comprising: a power chip; a voltage driving chip electrically connected with power chip, and voltage driving chip includes a photocoupler device, and the photocoupler device includes a light emitting device and a photosensitive device;

wherein, a first output terminal of the power chip is connected to a first terminal of the light emitting device, and a second terminal of the light emitting device is connected to a ground; a second output terminal of the power chip is connected to a first terminal of the photosensitive device, and a second terminal of the photosensitive device is connected to an output terminal of the photocoupler device; the photocoupler device controls a working status of the light emitting device according to a control voltage outputted from the first output terminal of the power chip, and the photosensitive device is turned on or turned off according to the working status of the light emitting device; the second output terminal of the power chip outputs a driving voltage, and the driving voltage is outputted through the output terminal of the photocoupler device when the light emitting device is turned on.

Wherein, the driving voltage is greater than the control voltage, and the output terminal of the photocoupler device is used to supply a power to an active device in the voltage driving chip.

Wherein, when the control voltage outputted from the first output terminal of the power chip is at a high voltage level, the photocoupler device controls the light emitting device to be in a light-emitting status according to the high voltage level of the control voltage outputted from the first output terminal of the power chip, the photosensitive device is turned on according to the light-emitting status of the light emitting device, and the driving voltage outputted from the second output terminal of the power chip is outputted to the output terminal of the photocoupler device.

Wherein, when the control voltage outputted from the first output terminal of the power chip is at a low voltage level, the photocoupler device controls the light emitting device to be in a extinguished state according to the low voltage level of control voltage outputted from the first output terminal of the power chip, the photosensitive device is turned off according to the extinguished state of the light emitting device, and the second output terminal of the power chip stops outputting the driving voltage to the output terminal of the photocoupler device.

Wherein, the circuit further includes a first resistor, the first output terminal of the power chip is connected to the first terminal of the light emitting device through the first resistor.

Wherein, the circuit further includes a second resistor, and the second terminal of the photosensitive device is connected to a ground through the second resistor.

Wherein, the light emitting device includes a light emitting diode, wherein: the first output terminal of the power chip is connected to a positive terminal of the light emitting diode through a first resistor, and a negative terminal of the light emitting diode is connected to a ground.

Wherein, the photosensitive device includes a phototransistor, wherein: the second output terminal of the power chip is connected to a collector of the phototransistor, an emitter of the phototransistor is connected to a ground through a second resistor, and the emitter of the phototransistor is connected to the output terminal of the photocoupler device.

Wherein, the voltage driving chip is a high voltage driving chip, the phototransistor includes a NPN phototransistor, wherein: the second output terminal of the power chip is connected to a collector of the NPN phototransistor, an emitter of the NPN phototransistor is connected to a ground through a second resistor, the emitter of the NPN phototransistor is connected to the output terminal of the photocoupler device in the high voltage driving chip, and the second output terminal of the power chip is used to output the driving voltage to the collector of the NPN phototransistor.

Wherein, the voltage driving chip is a low voltage driving chip, the phototransistor includes a PNP phototransistor, wherein: the second output terminal of the power chip is connected to a collector of the PNP phototransistor, an emitter of the PNP phototransistor is connected to a ground through a second resistor, the emitter of the PNP phototransistor is connected to the output terminal of the photocoupler device in the high voltage driving chip, and the second output terminal of the power chip is used to output the driving voltage to the collector of the PNP phototransistor.

The photocoupler isolation switch circuit of the present invention, through adding a photocoupler device in the voltage driving chip, and the photocoupler device includes a power chip, and a voltage driving chip electrically connected with power chip, and voltage driving chip includes a photocoupler device, and the photocoupler device includes a light emitting device and a photosensitive device; wherein, a first output terminal of the power chip is connected to a first terminal of the light emitting device, and a second terminal of the light emitting device is connected to a ground; a second output terminal of the power chip is connected to a first terminal of the photosensitive device, and a second terminal of the photosensitive device is connected to an output terminal of the photocoupler device; the photocoupler device controls a working status of the light emitting device according to a control voltage outputted from the first output terminal of the power chip, and the photosensitive device is turned on or turned off according to the working status of the light emitting device; the second output terminal of the power chip outputs a driving voltage, and the driving voltage is outputted through the output terminal of the photocoupler device when the light emitting device is turned on. Therefore, the photocoupler isolation switch circuit of the embodiment of the present invention can solve the latch up effect of the voltage driving chip in order to prevent the latch up effect from breaking the voltage driving chip.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

The embodiment of the present invention provides a photocoupler isolation switch circuit and manufacturing for the same according to an embodiment of the present invention. The present invention can solve a latch up problem generated by the voltage driving chip. The following will describe in detail.

Figure 1:
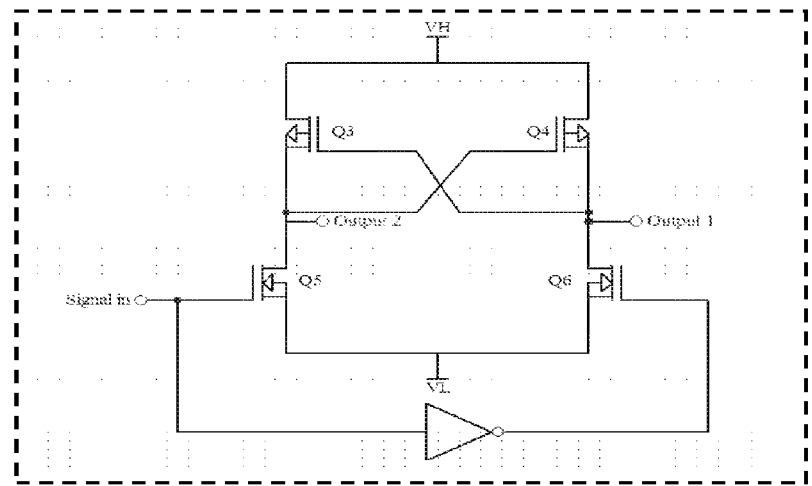
FIG. 1 is a schematic diagram of a level shifter circuit of a voltage driving chip.

With reference to FIG. 1, and FIG. 1 is a schematic diagram of a level shifter circuit of a voltage driving chip. The level shifter circuit of the voltage driving chip includes a CMOS element. As shown in FIG. 1, the level shifter circuit of the voltage driving chip includes two PMOS (Q3 and Q4), two NMOS (Q5 and Q6) and an inverter. Wherein, a first input terminal Signal in of the level shifter circuit is connected to a gate of the Q5 and an input terminal of the inverter. An output terminal of the inverter is connected to a gate of the Q6. A second input terminal VH of the level shifter circuit is connected to a drain of the Q3 and a drain of the Q4 (Q3 and Q4 are common drain). A third input terminal VL of the level shifter circuit is connected to a source of the Q5 and the source of the Q6 (Q5 and Q6 are common source). A first output terminal Output of the level shifter is connected to a gate of Q3, a source of Q4 and a drain of Q5. The first input terminal Signal in of the level shifter circuit is used for receiving a control signal outputted from a power chip. The second input terminal VH of the level shifter circuit is used for receiving a first driving voltage (can be defined as a high voltage level), and The third input terminal VL of the level shifter circuit is used for receiving a second driving voltage (can be defined as a low voltage level).

When the control signal is inputted to the level shifter circuit before the first driving voltage and the second driving voltage, if the control signal inputted to the first input terminal Signal in of the level shifter circuit is at a high voltage level (such as 3.3V), The high voltage level control signal is inputted to the gate of the Q5, and the control signal become a low voltage level after passing through the inverter, and transmitting to the gate of the Q6 such that the second driving voltage received at the third input terminal VL of the level shifter is transmitted to the sources of Q5 and Q6, that is, the Q5 is turned on and Q6 is turned off Therefore, the second output terminal Output2 outputs the second driving voltage.

At the same time, the gate of Q4 receives the second driving voltage, and Q4 is turned on, the first output terminal Output1 of the level shifter circuit outputs the first driving voltage; If the control signal inputted to the first input terminal Signal in of the level shifter circuit is at a low voltage level (such as 0V), the low voltage level control signal is transmitted to the gate of the Q5, the control signal becomes a high voltage level, and transmitting to the gate of Q6, the second driving voltage received at the third input terminal VL of the level shifter circuit is inputted to the sources of Q5 and Q6, that is Q5 is turned off and Q6 is turned on, the first output terminal Output1 of the level shifter circuit outputs the second driving voltage. At the same time, the gate of Q3 receives the second driving voltage, and Q3 is turned on, the second output terminal Output2 of the level shifter circuit outputs the first driving voltage. However, when the control signal is inputted to the level shifter circuit after the first driving voltage and the second driving voltage, between the second input terminal VH and the third input VL, a large current will generate, the CMOS formed by Q3 and Q5 and the CMOS formed by Q4 and Q6 in the level shifter circuit are easily to generate a latch up effect so as to break the MOS transistors in the voltage driving chip.

Figure 2:
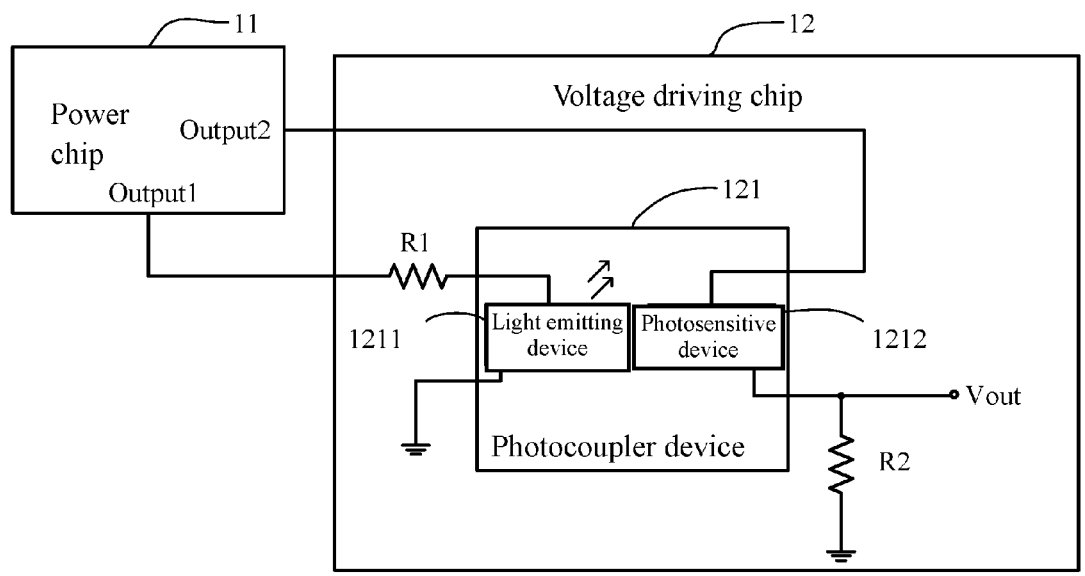
FIG. 2 is a schematic circuit diagram of a photocoupler isolation switch circuit according to an embodiment of the present invention.

With reference to FIG. 2, FIG. 2 is a schematic circuit diagram of a photocoupler isolation switch circuit according to an embodiment of the present invention. As shown in FIG.

2, the photocoupler described in the embodiment of the present invention includes a power chip 11 and a voltage driving chip 12 electrically connected with power chip 11, the voltage driving chip 12 includes photocoupler device 121, and the photocoupler device 121 includes a light emitting device 1211 and a photosensitive device 1212.

The first output terminal Output1 of the power chip 11 is connected to a first terminal of the light emitting device 1211 of the photocoupler device 121 through a first resistor R1, and a second terminal of the light emitting device 1211 is connected to a ground, the second output terminal Output2 of the power chip 11 is connected to a first terminal of the photosensitive device 1212 of the photocoupler device 121. A second terminal of the photosensitive device 1212 is connected to a ground through a second resistor R2. The second terminal of the photosensitive device 1212 is also connected to an output terminal Vout of the photocoupler device 121. The output terminal Vout of the photocoupler device 121 is used to supply power to active devices in the voltage driving chip 12. The active devices, in short, a device that requires power to work, and can be a transistor, a diode, a FET (including MOS tube) or an operational amplifier, etc.

The light emitting device 1211 and a photosensitive device 1212 of the photocoupler device 121 can be installed in an enclosed housing, and the light emitting device 1211 and a photosensitive device 1212 are isolated by a transparent insulator. Applying a voltage signal at an input terminal of the photocoupler device 121 can make the light emitting device 1211 to emit light, and an intensity of the light depends on a current. After the light emitted from the light emitting device 1211 irradiates to the photosensitive device 1212 installed together, the photosensitive device 1212 can generate a corresponding current, and flowing out through the output terminal Vout of the photocoupler device 121.

Specifically, the first output terminal Output1 of the power chip 11 is used to output a control voltage, and the second output terminal Output2 of the power chip 11 is used to output a driving voltage to the first terminal of the photosensitive device 1212, the driving voltage is greater than the control voltage. The photocoupler device 121 controls a working status of the light emitting device 1211 according to the control voltage outputted from the first output terminal Output1 of the power chip 11. The photosensitive device 1212 is turned on or turned off according to the working status of the light emitting device 1211. The second output terminal Output2 of the power chip 11 outputs the driving voltage, and the driving voltage is outputted through the output terminal of the photocoupler device 121 when the light emitting device 1211 is turned on.

In the present embodiment, the first output terminal Output1 of the power chip 11 is used to output the control voltage, the second output terminal Output2 of the power chip 11 is used to output the driving signal to the first terminal of the photosensitive device 1212, and the driving voltage is greater than the control voltage. Preferably, an absolute value of an amplitude of the driving voltage is 5~30V (such as 15V), and the control voltage is a pulse signal.

When the control voltage outputted from the first output terminal Output1 of the power chip 11 is at a high voltage level (such as 3.3V), the photocoupler device 121 controls the light emitting device 1211 to be turned on according to the high voltage level of the control voltage outputted from the first output terminal Output1 of the power chip 11, and emits a light signal (that is, under a light-emitting working status). The photosensitive device 1212 receives the light signal emitted from the light emitting device 1211 according to the light emitting status of the light emitting device 1211 and converts into an electric signal. At this time, the photosensitive device 1212 is turned on, the driving voltage outputted from the second output terminal Output2 of the power chip 11 is outputted through the output terminal Vout of the photocoupler device 121.

Because the control voltage rises up before the driving voltage (that is, in a timing, the control voltage is prior to the driving voltage), and the driving voltage is greater than the control voltage such that the CMOS circuit in the voltage driving chip 12 can work normally so that the latch up effect will not generate. When the control voltage outputted from the first output terminal Output1 of the power chip 11 is at a low voltage level (such as 0V), the driving voltage outputted from the second output terminal Output2 of the power chip 11 rises up before the control voltage outputted from the first output terminal Output1 of the power chip 11, because at this time, no voltage is applied on the first terminal of the light emitting device 1211, the photocoupler device 121 controls the light emitting device 1211 to not emit light (that is, in a extinguished state) according to the low voltage level of the control voltage outputted from the first output terminal Output1 of the power chip 11 so that the photosensitive device 1212 is turned off according to the extinguished state of the light-emitting device 1211, the second terminal Output2 of the power chip 11 stop outputting the driving voltage to the output terminal Vout of the photocoupler device 121. Accordingly, the voltage driving chip 12 will not generate the latch up effect.

Accordingly, no matter the control voltage outputted from the first output terminal Output1 of the power chip 11 is at a high voltage level or a low voltage level, the voltage driving chip 12 will not generate the latch up effect. Therefore, the photocoupler isolation switch circuit of the embodiment of the present invention can solve the latch up effect of the voltage driving chip 12 in order to prevent the latch up effect from breaking the voltage driving chip 12.

In the photocoupler isolation switch circuit described in FIG. 2, the photocoupler device added inside the voltage driving chip 12 can outputs the driving voltage outputted from the second output terminal Output2 of the power chip 11 to the output terminal Vout of the photocoupler device 121. When the control voltage outputted from the first output terminal Output1 of the power chip 11 is at a low voltage level (that is, the control voltage rises up after the driving voltage, and in timing, the control voltage is late with respect to the driving voltage), the driving voltage outputted from the second output terminal Output2 of the power chip 11 will not be outputted to the output terminal Vout of the photocoupler device 121 in order to avoid the voltage driving chip 12 from generating the latch up effect, and preventing the voltage driving chip 12 from breaking because of the latch up effect.

Figure 3:
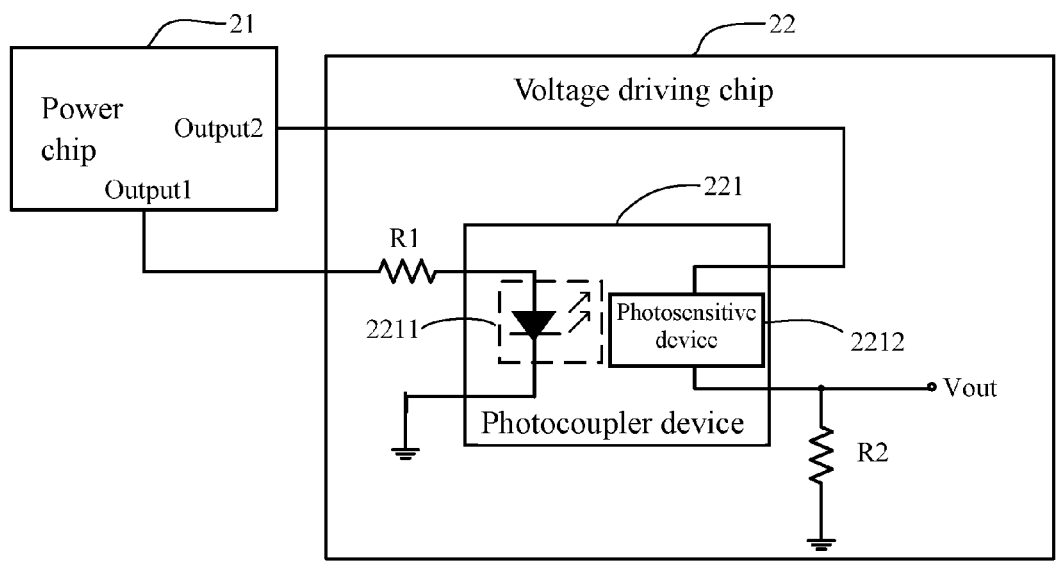
FIG. 3 is a schematic diagram of another photocoupler isolation switch circuit according to an embodiment of the present invention.

With reference to FIG. 3, FIG. 3 is a schematic circuit diagram of another photocoupler isolation switch circuit according to an embodiment of the present invention. As shown in FIG. 3, the photocoupler isolation switch circuit descried in the embodiment of the present invention includes a power chip 21 and a voltage driving chip 22 electrically connected with power chip 21, the voltage driving chip 22 includes a photocoupler device 221, and the photocoupler device 221 includes a light emitting device 2211 and a photosensitive device 2212.

The light emitting device 2211 includes a light emitting diode, a first output terminal Output1 of the power chip 21 is connected to a positive terminal of the light emitting diode through a first resistor R1, and a negative terminal of the light emitting diode is connected to a ground. A second output terminal Output2 of the power chip 21 is connected to a first terminal of the photosensitive device 2212 of the photocoupler device 221. A second terminal of the photosensitive device 2212 is connected to a ground through a second resistor R2. The second terminal of the photosensitive device 2212 is also connected to an output terminal Vout of the photocoupler device 221. The output terminal Vout of the photocoupler device 221 is used to supply power to active devices in the voltage driving chip 22.

Specifically, the first output terminal Output1 of the power chip 21 is used to output a control voltage, and the second output terminal Output2 of the power chip 21 is used to output a driving voltage to the first terminal of the photosensitive device 2212, the driving voltage is greater than the control voltage. The photocoupler device 221 control a working status of the light emitting diode 2211 according to the control voltage outputted from the first output terminal Output1 of the power chip 21. The photosensitive device 2212 is turned on or turned off according to the working status of the light emitting diode 2211. The second output terminal Output2 of the power chip 21 outputs the driving voltage, and the driving voltage is outputted through output terminal of the photocoupler device 221 when the light emitting diode 2211 is turned on.

In the present embodiment, the first output terminal Output1 of the power chip 21 is used to output the control voltage, the second output terminal Output2 of the power chip 21 is used to output the driving signal to the first terminal of the photosensitive device 2212, and the driving voltage is greater than the control voltage. Preferably, absolute value of an amplitude of the driving voltage is 5~30V (such as 15V), and the control voltage is a pulse signal.

When the control voltage outputted from the first output terminal Output1 of the power chip 21 is at a high voltage level (such as 3.3V), the photocoupler device 221 controls the light emitting diode 2211 to be turned on according to the high voltage level of the control voltage outputted from the first output terminal Output1 of the power chip 21, and emits a light signal (that is under a light emitting working status). The photosensitive device 2212 receives the light signal emitted from the light emitting diode 2211 according to the light emitting status of the light emitting diode 2211 and converts into an electric signal. At this time, the photosensitive device 2212 is turned on, the driving voltage outputted from the second output terminal Output2 of the power chip 21 is outputted through the output terminal Vout of the photocoupler device 221.

Because the control voltage rises up before the driving voltage (that is, in a timing, the control voltage is prior to the driving voltage), and the driving voltage is greater than the control voltage such that the CMOS circuit in the voltage driving chip 22 can work normally so that the latch up effect will not generate. When the control voltage outputted from the first output terminal Output1 of the power chip 21 is at a low voltage level (such as 0V), the driving voltage outputted from the second output terminal Output2 of the power chip 21 rises up before the control voltage outputted from the first output terminal Output1 of the power chip 21, because at this time, no voltage is applied on the first terminal of the light emitting diode 2211, the photocoupler device 221 controls the light emitting diode 2211 to not emit a light signal (that is, in a extinguished state) according to the low voltage level of control voltage outputted from the first output terminal Output1 of the power chip 21 so that the photosensitive device 2212 is turned off according to the extinguished state of the light emitting diode 2211. The second output terminal Output2 of the power chip 21 stops outputting the driving voltage to the output terminal Vout of the photocoupler device 221. Accordingly, the voltage driving chip 22 will not generate the latch up effect.

Accordingly, no matter the control voltage outputted from the first output terminal Output1 of the power chip 21 is at a high voltage level or a low voltage level, the voltage driving chip 22 will not generate the latch up effect. Therefore, the photocoupler isolation switch circuit of the embodiment of the present invention can solve the latch up effect of the voltage driving chip 22 in order to prevent the latch up effect from breaking the voltage driving chip 22.

The embodiment of the present invention discloses another photocoupler isolation switch circuit including a power chip and a voltage driving chip electrically connected with power chip, the voltage driving chip includes a photocoupler device, and the photocoupler device includes a light emitting device and a photosensitive device.

The light emitting device includes a light emitting diode, a first output terminal of the power chip is connected to a positive terminal of the light emitting diode through a first resistor, and a second terminal of the light emitting diode is connected to a ground. The photosensitive device includes a phototransistor. A second output terminal of the power chip is connected to a collector of the phototransistor, an emitter of the phototransistor is connected to a ground through a second resistor R2. The emitter of the phototransistor is also connected to an output terminal of the photocoupler device in the voltage driving chip. The output terminal of the photocoupler device is used to supply power to active devices in the voltage driving chip.

Specifically, the first output terminal Output1 of the power chip is used to output a control voltage, and the second output terminal Output2 of the power chip is used to output a driving voltage to the collector of the phototransistor, the driving voltage is greater than the control voltage. The photocoupler device controls a working status of the light emitting diode according to the control voltage outputted from the first output terminal of the power chip. The phototransistor is turned on or turned off according to the working status of the light emitting diode. The second output terminal of the power chip outputs the driving voltage, and the driving voltage is outputted through output terminal of the photocoupler device when the light emitting diode is turned on.

In the present embodiment, the first output terminal of the power chip is used to output the control voltage, the second output terminal of the power chip is used to output the driving signal to the collector of the phototransistor, and the driving voltage is greater than the control voltage. Preferably, absolute value of an amplitude of the driving voltage is 5~30V (such as 15V), and the control voltage is a pulse signal.

When the control voltage outputted from the first output terminal of the power chip is at a high voltage level (such as 3.3V), the photocoupler device controls the light emitting diode to be in a light-emitting status according to the high voltage level of the control voltage outputted from the first output terminal of the power chip, the phototransistor is turned on according to the light-emitting status of the light emitting diode, the driving voltage outputted from the second output terminal of the power chip is outputted through the output terminal Vout of the photocoupler device so that the CMOS circuit in the voltage driving chip can word; when the control voltage outputted from the first output terminal of the power chip is at a low voltage level (such as 0V), the driving voltage outputted from the second output terminal of the power chip rises up before the control voltage outputted from the first output terminal of the power chip, because at this time, no voltage is applied on the positive terminal of the light emitting diode, the photocoupler device controls the light emitting diode to not emit a light signal (that is, in a extinguished state) according to the low voltage level of control voltage outputted from the first output terminal of the power chip so that the phototransistor is turned off according to the extinguished state of the light emitting diode. The second terminal of the power chip stops outputting the driving voltage to the output terminal Vout of the photocoupler device. Accordingly, the voltage driving chip will not generate the latch up effect. In the embodiment of the present invention, the photocoupler device added inside the voltage driving chip can solve the latch up problem generated by the voltage driving chip, and prevent the voltage driving chip from breaking because of the latch up effect.

Figure 4:
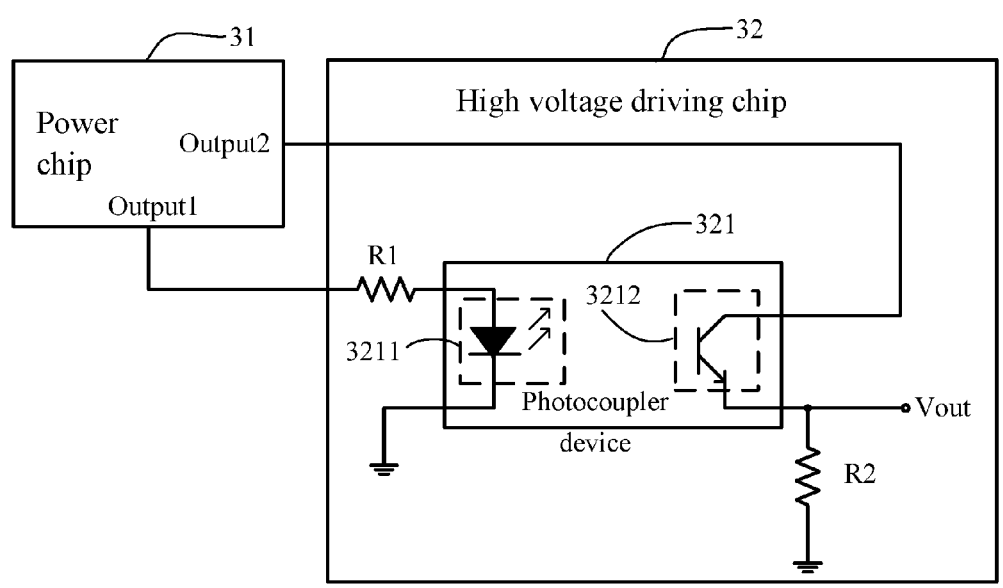
FIG. 4 is a schematic diagram of another photocoupler isolation switch circuit according to an embodiment of the present invention.

With reference to FIG. 4, FIG. 4 is a schematic circuit diagram of another photocoupler isolation switch circuit according to an embodiment of the present invention. As shown in FIG. 4, the photocoupler isolation switch circuit descried in the embodiment of the present invention includes a power chip 31 and a voltage driving chip 32 electrically connected with power chip 31, the voltage driving chip 32 includes a photocoupler device 321, and the photocoupler device 321 includes a light emitting device 3211 and a photosensitive device 3212.

The light emitting device 3211 includes a light emitting diode, a first output terminal Output1 of the power chip 31 is connected to a positive terminal of the light emitting diode through a first resistor R1, and a negative terminal of the light emitting diode is connected to a ground. The voltage driving chip 32 is a high voltage driving chip, the photosensitive device 3212 includes a phototransistor, and the phototransistor is a NPN phototransistor. A second output terminal Output2 of the power chip 31 is connected to a collector of the NPN phototransistor of the photocoupler device 321. An emitter of the NPN phototransistor is connected to a ground through a second resistor R2. The emitter of the NPN phototransistor is also connected to an output terminal Vout of the photocoupler device 321. The second output terminal Output2 of the power chip 31 is used to output the driving voltage VH to the collector of the NPN phototransistor, and the output terminal Vout of the photocoupler device 321 is used to supply power to active devices in the voltage driving chip 32.

Specifically, the first output terminal Output1 of the power chip 31 is used to output a control voltage, and the second output terminal Output2 of the power chip 31 is used to output a driving voltage VH to the collector of the NPN phototransistor, the driving voltage VH is greater than the control voltage. The photocoupler device 321 control a working status of the light emitting diode 3211 according to the control voltage outputted from the first output terminal Output1 of the power chip 31. The NPN phototransistor 3212 is turned on or turned off according to the working status of the light emitting diode 3211. The second output terminal Output2 of the power chip 31 outputs the driving voltage VH, and the driving voltage is outputted through output terminal of the photocoupler device 321 when the light emitting diode 3211 is turned on.

In the present embodiment, the first output terminal Output1 of the power chip 31 is used to output the control voltage, the second output terminal Output2 of the power chip 31 is used to output the driving signal VH to the collector of the NPN phototransistor device 3212, and the high driving voltage VH is greater than the control voltage. Preferably, absolute value of an amplitude of the high driving voltage is 5~30V (such as 15V), and the control voltage is a pulse signal.

When the control voltage outputted from the first output terminal Output1 of the power chip 31 is at a high voltage level (such as 3.3V), the photocoupler device 321 controls the light emitting diode 3211 to be turned on according to the high voltage level of the control voltage outputted from first output terminal Output1 of the power chip 31, and emits a light signal (that is under a light-emitting working status). The NPN phototransistor receives the light signal emitted from the light emitting diode 3211 according to the light emitting status of the light emitting diode 3211 and converts into an electric signal. At this time, the NPN phototransistor device 3212 is turned on, the driving voltage VH outputted from the second output terminal Output2 of the power chip 31 is outputted through the output terminal Vout of the photocoupler device 321 so that the CMOS circuit in the high voltage driving chip 32 can work without generating the latch up effect; when the control voltage outputted from the first output terminal Output1 of the power chip 31 is at a low voltage level (such as 0V), the driving voltage VH outputted from the second output terminal Output2 of the power chip 31 rises up before the control voltage outputted from the first output terminal Output1 of the power chip 31, because at this time, no voltage is applied on the positive terminal of the light emitting diode, the photocoupler device 321 controls the light emitting diode 3211 to not emit a light signal (that is, in a extinguished state) according to the low voltage level of control voltage outputted from the first output terminal Output1 of the power chip so that the NPN phototransistor is turned off according to the extinguished state of the light emitting diode 3211. The second output terminal Output2 of the power chip 31 stops outputting the driving voltage VH to the output terminal Vout of the photocoupler device 321. Accordingly, the voltage driving chip 22 will not generate the latch up effect. Therefore, in the embodiment of the present invention, the photocoupler device added inside the voltage driving chip can solve the latch up problem generated by the high voltage driving chip 32, and prevent the high voltage driving chip 32 from breaking because of the latch up effect.

Figure 5:
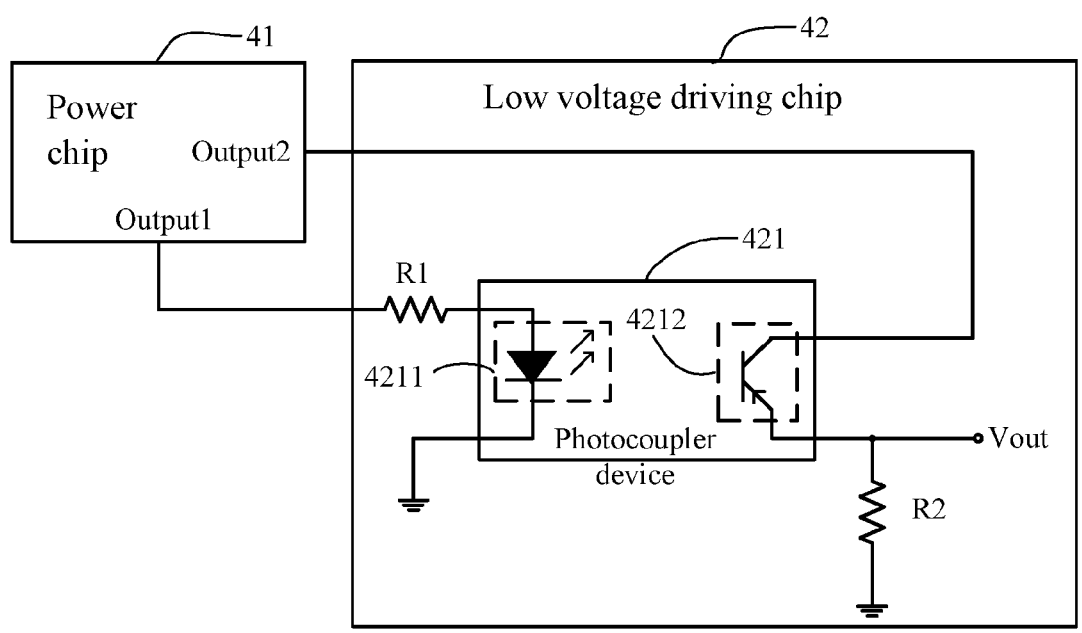
FIG. 5 is a schematic diagram of another photocoupler isolation switch circuit according to an embodiment of the present invention.

With reference to FIG. 5, FIG. 5 is a schematic circuit diagram of another photocoupler isolation switch circuit according to an embodiment of the present invention. As shown in FIG. 5, the photocoupler isolation switch circuit descried in the embodiment of the present invention includes a power chip 41 and a voltage driving chip 42 electrically connected with power chip 41, the voltage driving chip 42 includes a photocoupler device 421, and the photocoupler device 421 includes a light emitting device 4211 and a photosensitive device 4212.

The light emitting device 4211 includes a light emitting diode, a first output terminal Output1 of the power chip 41 is connected to a positive terminal of the light emitting diode through a first resistor R1, and a negative terminal of the light emitting diode is connected to a ground.

The voltage driving chip 42 is a low voltage driving chip, the photosensitive device 4212 includes a phototransistor, and the phototransistor is a PNP phototransistor. A second output terminal Output2 of the power chip 41 is connected to a collector of the PNP phototransistor of the photocoupler device 421. An emitter of the PNP phototransistor is connected to a ground through a second resistor R2. The emitter of the PNP phototransistor is also connected to an output terminal Vout of the photocoupler device 421. The second output terminal Output2 of the power chip 41 is used to output the driving voltage to the collector of the PNP phototransistor, and the output terminal Vout of the photocoupler device 421 is used to supply power to active devices in the voltage driving chip 42.

Specifically, the first output terminal Output1 of the power chip 41 is used to output a control voltage, and the second output terminal Output2 of the power chip 41 is used to output a driving voltage VL to the collector of the PNP phototransistor, the driving voltage VL is greater than the control voltage. The photocoupler device 421 controls a working status of the light emitting diode 4211 according to the control voltage outputted from the first output terminal Output1 of the power chip 41. The PNP phototransistor 4212 is turned on or turned off according to the working status of the light emitting diode 4211. The second output terminal Output2 of the power chip 41 outputs the driving voltage VL, and the driving voltage is outputted through output terminal of the photocoupler device 421 when the light emitting diode 4211 is turned on.

In the present embodiment, the first output terminal Output1 of the power chip 41 is used to output the control voltage, the second output terminal Output2 of the power chip 41 is used to output the driving signal VL to the collector of the PNP phototransistor device 4212, and the low driving voltage VL is greater than the control voltage. Preferably, absolute value of an amplitude of the driving voltage VL is 5~30V (such as 15V), and the control voltage is a pulse signal.

When the control voltage outputted from the first output terminal Output1 of the power chip 41 is at a high voltage level (such as 3.3V), the photocoupler device 421 controls the light emitting diode 4211 to be turned on according to the high voltage level of the control voltage outputted from the first output terminal Output1 of the power chip 41, and emits a light signal (that is under a light-emitting working status). The PNP phototransistor receives the light signal emitted from the light emitting diode 4211 according to the light emitting status of the light emitting diode 4211 and converts into an electric signal. At this time, the PNP phototransistor device 4212 is turned on, the driving voltage VL outputted from the second output terminal Output2 of the power chip 41 is outputted through the output terminal Vout of the photocoupler device 421 so that the CMOS circuit in the low voltage driving chip 42 can work without generating the latch up effect; when the control voltage outputted from the first output terminal Output1 of the power chip 41 is at a low voltage level (such as 0V), the driving voltage VL outputted from the second output terminal Output2 of the power chip 41 rises up before the control voltage outputted from the first output terminal Output1 of the power chip 41, because at this time, no voltage is applied on the positive terminal of the light emitting diode 4211, the photocoupler device 421 controls the light emitting diode 4211 to not emit a light signal (that is, in a extinguished state) according to the low voltage level of the control voltage outputted from the first output terminal Output1 of the power chip 41 so that the PNP phototransistor is turned off according to the extinguished state of the light emitting diode 3211. The second terminal Output2 of the power chip 41 stops outputting the driving voltage VL to the output terminal Vout of the photocoupler device 421. Accordingly, the low voltage driving chip 42 will not generate the latch up effect. Therefore, in the embodiment of the present invention, the photocoupler device added inside the voltage driving chip can solve the latch up problem generated by the low voltage driving chip 42, and prevent the low voltage driving chip 42 from breaking because of the latch up effect.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A photocoupler isolation switch circuit comprising:
   a power chip; and
   a voltage driving chip electrically connected with power chip, and voltage driving chip includes a photocoupler device, and the photocoupler device includes a light emitting device and a photosensitive device;
   wherein, a first output terminal of the power chip is connected to a first terminal of the light emitting device, and a second terminal of the light emitting device is connected to a ground; a second output terminal of the power chip is connected to a first terminal of the photosensitive device, and a second terminal of the photosensitive device is connected to an output terminal of the photocoupler device; the photocoupler device controls a working status of the light emitting device according to a control voltage outputted from the first output terminal of the power chip, and the photosensitive device is turned on or turned off according to the working status of the light emitting device; the second output terminal of the power chip outputs a driving voltage, and the driving voltage is outputted through the output terminal of the photocoupler device when the light emitting device is turned on.

2. The circuit according to claim 1, wherein, the driving voltage is greater than the control voltage, and the output terminal of the photocoupler device is used to supply a power to an active device in the voltage driving chip.

3. The circuit according to claim 1, wherein, when the control voltage outputted from the first output terminal of the power chip is at a high voltage level, the photocoupler device controls the light emitting device to be in a light-emitting status according to the high voltage level of the control voltage outputted from the first output terminal of the power chip, the photosensitive device is turned on according to the light-emitting status of the light emitting device, and the driving voltage outputted from the second output terminal of the power chip is outputted to the output terminal of the photocoupler device.

4. The circuit according to claim 1, wherein, when the control voltage outputted from the first output terminal of the power chip is at a low voltage level, the photocoupler device controls the light emitting device to be in a extinguished state according to the low voltage level of control voltage outputted from the first output terminal of the power chip, the photosensitive device is turned off according to the extinguished state of the light emitting device, and the second output terminal of the power chip stops outputting the driving voltage to the output terminal of the photocoupler device.

5. The circuit according to claim 1, wherein, the circuit further includes a first resistor, the first output terminal of the power chip is connected to the first terminal of the light emitting device through the first resistor.

6. The circuit according to claim 1, wherein, the circuit further includes a second resistor, and the second terminal of the photosensitive device is connected to a ground through the second resistor.

7. The circuit according to claim 1, wherein, the light emitting device includes a light emitting diode, wherein:
the first output terminal of the power chip is connected to a positive terminal of the light emitting diode through a first resistor, and a negative terminal of the light emitting diode is connected to a ground.

8. The circuit according to claim 2, wherein, the light emitting device includes a light emitting diode, wherein:
the first output terminal of the power chip is connected to a positive terminal of the light emitting diode through a first resistor, and a negative terminal of the light emitting diode is connected to a ground.

9. The circuit according to claim 1, wherein, the photosensitive device includes a phototransistor, wherein:
the second output terminal of the power chip is connected to a collector of the phototransistor, an emitter of the phototransistor is connected to a ground through a second resistor, and the emitter of the phototransistor is connected to the output terminal of the photocoupler device.

10. The circuit according to claim 2, wherein, the photosensitive device includes a phototransistor, wherein:
the second output terminal of the power chip is connected to a collector of the phototransistor, an emitter of the phototransistor is connected to a ground through a second resistor, and the emitter of the phototransistor is connected to the output terminal of the photocoupler device.

11. The circuit according to claim 3, wherein, the photosensitive device includes a phototransistor, wherein:
the second output terminal of the power chip is connected to a collector of the phototransistor, an emitter of the phototransistor is connected to a ground through a second resistor, and the emitter of the phototransistor is connected to the output terminal of the photocoupler device.

12. The circuit according to claim 5, wherein, the photosensitive device includes a phototransistor, wherein:
the second output terminal of the power chip is connected to a collector of the phototransistor, an emitter of the phototransistor is connected to a ground through a second resistor, and the emitter of the phototransistor is connected to the output terminal of the photocoupler device.

13. The circuit according to claim 6, wherein, the photosensitive device includes a phototransistor, wherein:
the second output terminal of the power chip is connected to a collector of the phototransistor, an emitter of the phototransistor is connected to a ground through a second resistor, and the emitter of the phototransistor is connected to the output terminal of the photocoupler device.

14. The circuit according to claim 9, wherein, the voltage driving chip is a high voltage driving chip, the phototransistor includes a NPN phototransistor, wherein:
the second output terminal of the power chip is connected to a collector of the NPN phototransistor, an emitter of the NPN phototransistor is connected to a ground through a second resistor, the emitter of the NPN phototransistor is connected to the output terminal of the photocoupler device in the high voltage driving chip, and the second output terminal of the power chip is used to output the driving voltage to the collector of the NPN phototransistor.

15. The circuit according to claim 10, wherein, the voltage driving chip is a high voltage driving chip, the phototransistor includes a NPN phototransistor, wherein:
the second output terminal of the power chip is connected to a collector of the NPN phototransistor, an emitter of the NPN phototransistor is connected to a ground through a second resistor, the emitter of the NPN phototransistor is connected to the output terminal of the photocoupler device in the high voltage driving chip, and the second output terminal of the power chip is used to output the driving voltage to the collector of the NPN phototransistor.

16. The circuit according to claim 11, wherein, the voltage driving chip is a high voltage driving chip, the phototransistor includes a NPN phototransistor, wherein:
the second output terminal of the power chip is connected to a collector of the NPN phototransistor, an emitter of the NPN phototransistor is connected to a ground through a second resistor, the emitter of the NPN phototransistor is connected to the output terminal of the photocoupler device in the high voltage driving chip, and the second output terminal of the power chip is used to output the driving voltage to the collector of the NPN phototransistor.

17. The circuit according to claim 12, wherein, the voltage driving chip is a high voltage driving chip, the phototransistor includes a NPN phototransistor, wherein:
the second output terminal of the power chip is connected to a collector of the NPN phototransistor, an emitter of the NPN phototransistor is connected to a ground through a second resistor, the emitter of the NPN phototransistor is connected to the output terminal of the photocoupler device in the high voltage driving chip, and the second output terminal of the power chip is used to output the driving voltage to the collector of the NPN phototransistor.

18. The circuit according to claim 13, wherein, the voltage driving chip is a high voltage driving chip, the phototransistor includes a NPN phototransistor, wherein:
the second output terminal of the power chip is connected to a collector of the NPN phototransistor, an emitter of the NPN phototransistor is connected to a ground through a second resistor, the emitter of the NPN phototransistor is connected to the output terminal of the photocoupler device in the high voltage driving chip, and the second output terminal of the power chip is used to output the driving voltage to the collector of the NPN phototransistor.

19. The circuit according to claim 9, wherein, the voltage driving chip is a low voltage driving chip, the phototransistor includes a PNP phototransistor, wherein:
the second output terminal of the power chip is connected to a collector of the PNP phototransistor, an emitter of the PNP phototransistor is connected to a ground through a second resistor, the emitter of the PNP phototransistor is connected to the output terminal of the photocoupler device in the high voltage driving chip, and the second output terminal of the power chip is used to output the driving voltage to the collector of the PNP phototransistor.

20. The circuit according to claim 11, wherein, the voltage driving chip is a low voltage driving chip, the phototransistor includes a PNP phototransistor, wherein:
the second output terminal of the power chip is connected to a collector of the PNP phototransistor, an emitter of the PNP phototransistor is connected to a ground through a second resistor, the emitter of the PNP phototransistor is connected to the output terminal of the photocoupler device in the high voltage driving chip, and the second output terminal of the power chip is used to output the driving voltage to the collector of the PNP phototransistor.

* * * * *